US011754793B2

(12) United States Patent
Hashimoto et al.

(10) Patent No.: US 11,754,793 B2
(45) Date of Patent: Sep. 12, 2023

(54) EXCITATION LIGHT IRRADIATION DEVICE AND EXCITATION LIGHT IRRADIATION METHOD

(71) Applicant: SUMIDA CORPORATION, Tokyo (JP)

(72) Inventors: Masateru Hashimoto, Ueda (JP); Yoshiharu Yoshii, Natori (JP)

(73) Assignee: SUMIDA CORPORATION

( * ) Notice: Subject to any disclaimer, the term of this patent is extended or adjusted under 35 U.S.C. 154(b) by 0 days.

(21) Appl. No.: 17/711,111

(22) Filed: Apr. 1, 2022

(65) Prior Publication Data

US 2022/0229246 A1 Jul. 21, 2022

Related U.S. Application Data

(63) Continuation of application No. 17/223,177, filed on Apr. 6, 2021, now Pat. No. 11,320,607, which is a continuation of application No. 16/671,730, filed on Nov. 1, 2019, now Pat. No. 10,996,407.

(30) Foreign Application Priority Data

Dec. 27, 2018 (JP) .................. 2018-244101

(51) Int. Cl.
*G02B 6/42* (2006.01)
*G01R 33/26* (2006.01)
(52) U.S. Cl.
CPC ........... *G02B 6/4201* (2013.01); *G01R 33/26* (2013.01)
(58) Field of Classification Search
CPC . G02B 6/29365; G02B 6/29367; G01R 33/26
See application file for complete search history.

(56) References Cited

U.S. PATENT DOCUMENTS

| 5,616,922 A | 4/1997 | Reffner et al. |
| 7,366,371 B1 | 4/2008 | Wen et al. |
| 8,758,509 B2 | 6/2014 | Twitchen et al. |
| 10,073,264 B2 | 9/2018 | Amitai |

(Continued)

FOREIGN PATENT DOCUMENTS

WO 2012-038948 A2 3/2012

OTHER PUBLICATIONS

Steinert, S. et al.: "High sensitivity magnetic imaging using an array of spins in diamond"; Review of Scientific Instrument, Apr. 2010; 81(4):043705; AIP; College Park, Maryland, USA (13 pages).

(Continued)

*Primary Examiner* — Rhonda S Peace
(74) *Attorney, Agent, or Firm* — Harness, Dickey & Pierce, P.L.C.

(57) ABSTRACT

An excitation light irradiation device includes a substrate having a color center. The color center is excited by an excitation light incident to the substrate. The substrate includes first and second reflection surfaces facing each other, and first and second end surfaces facing each other. When the excitation light enters into the substrate, the incident excitation light travels from the first end surface to the second end surfaces while repeatedly reflecting between the first and second reflection surfaces. The second end surface is inclined. The second end surface reflects the incident excitation light so as to cause the incident excitation light to be emitted from one of the first and second reflection surfaces.

12 Claims, 2 Drawing Sheets

(56) References Cited

U.S. PATENT DOCUMENTS

| | | |
|---|---|---|
| 10,197,515 B2 | 2/2019 | Clevenson et al. |
| 10,317,279 B2 | 6/2019 | Bruce et al. |
| 10,330,744 B2 | 6/2019 | Luzod |
| 10,545,200 B2 | 1/2020 | Barry et al. |
| 10,648,933 B2 | 5/2020 | Clevenson et al. |
| 10,712,408 B2 | 7/2020 | Pham et al. |
| 10,996,407 B2 | 5/2021 | Hashimoto et al. |
| 2003/0133197 A1 | 7/2003 | Chang et al. |
| 2006/0280404 A1 | 12/2006 | Kennedy et al. |
| 2010/0329962 A1 | 12/2010 | Twitchen et al. |
| 2011/0090484 A1 | 4/2011 | Osterlund et al. |
| 2011/0157097 A1 | 6/2011 | Hamada et al. |
| 2015/0192532 A1 | 7/2015 | Clevenson et al. |
| 2016/0041387 A1 | 2/2016 | Valera et al. |
| 2017/0117981 A1 | 4/2017 | Li et al. |
| 2017/0293065 A1 | 10/2017 | Kim |
| 2018/0031768 A1 | 2/2018 | Miyata et al. |
| 2019/0361240 A1 | 11/2019 | Gelberg |
| 2020/0132785 A1 | 4/2020 | Yoshii |
| 2020/0209493 A1 | 7/2020 | Hashimoto et al. |
| 2020/0271735 A1 | 8/2020 | Takemura et al. |
| 2020/0292818 A1 | 9/2020 | Amitai et al. |
| 2020/0292819 A1 | 9/2020 | Danziger et al. |

OTHER PUBLICATIONS

Extended European Search Report for Patent Application No. EP 19219694.7 dated May 20, 2020 (10 pages).

EXCITATION LIGHT IRRADIATION DEVICE AND EXCITATION LIGHT IRRADIATION METHOD

CROSS-REFERENCE TO RELATED APPLICATIONS

This application is a continuation of U.S. patent application Ser. No. 17/223,177 filed Apr. 6, 2021, which is a continuation of U.S. patent application Ser. No. 16/671,730 filed Nov. 1, 2019, now U.S. Pat. No. 10,996,407, issued May 4, 2021, which claims priority to Japanese Patent Application No. 2018-244101, filed on Dec. 27, 2018, all of which are hereby expressly incorporated by reference herein in their entireties.

BACKGROUND

1. Technical Field

The present invention relates to an excitation light irradiation device and an excitation light irradiation method.

2. Related Art

In the recent years, a magnetic field measurement method based on an Optically Detected Magnetic Resonance (ODMR) by utilizing a color center (Farbe center or F center) has been developed.

With respect to the ODMR, since a high frequency magnetic field (a microwave) and light are respectively irradiated to a medium that has a sub-level and an optical transition level for excitations between the sub-levels and between the optical transitions, an electron occupancy number change due to a magnetic resonance between the sub-levels is detected with high sensitivity as an optical signal. In general, after an electron in a ground state is excited by a green light so as to be in an excited state, a red light is emitted when the electron goes back to the ground state from the excited state. For instance, when a high frequency magnetic field of approximately 2.87 GHz is irradiated, electrons in nitrogen vacancy centers (NVC) in a diamond structure transit from the lowest level (ms=0) among three sub-levels in the ground state to a one-step-higher-level (ms=±1), i.e., an energy orbit level in the ground state after initialization by an optical excitation is completed. When the electrons in the above described state are excited by the green light, a light emission quantity decreases because the electrons go back to the lowest level (ms=0) among the three sub-levels in the ground state with a radiationless transition (nonradiative transition). When such light explained above is detected, whether or not the magnetic resonance occurs is known due to the high frequency magnetic field. With respect to the ODMR, a light detection magnetic resonance material such as the NVC described above is utilized.

With respect to a certain magnetic field measurement method that utilizes the NVC, because a laser beam is incident on a diamond substrate that has the NVC, fluorescence is emitted from the NVC of the diamond substrate to which the laser beam is irradiated. Thereafter, the fluorescence that is emitted from the diamond substrate is detected by a charge coupled device (CCD). For instance, please see a non-patent literature, "High sensitivity magnetic imaging using an array of spins in diamond," S. Steinert, F. Dolde, P. Neumann, A. Aird, B. Naydenov, G. Balasubramanian, F. Jelezko, and J. Wrachtrup, Review of Scientific Instrument 81, 043705, published in 2010.

However, with respect to the magnetic field measurement method explained above, when total reflection conditions (an incident angle being less than a critical angle (e.g., 25 degrees)) are satisfied on the surface of the diamond substrate, it is difficult for the laser beam to travel into the inside of the diamond substrate (e.g., to enter into the diamond substrate) because the laser beam that is incident on the surface of the diamond substrate from outside is totally reflected from the surface of the diamond substrate. Further, because the laser beam that is incident on the surface of the diamond substrate from the inside of the diamond substrate is totally reflected on the surface of the diamond substrate, it is difficult for the laser beam to travel out to the outside of the diamond substrate (e.g., to be emitted from the diamond substrate).

In addition, the laser beam from outside passes through the diamond without any reflection when the total reflection conditions are not satisfied. Therefore, due to errors of the incident angle and the incident position of the laser beam that enters into the inside of the diamond substrate, an optical path (eventually, an optical path length) of the laser beam that travels inside the diamond substrate easily becomes irregular.

On the other hand, the longer the optical path of the laser beam inside the diamond substrate extends, the more the NVCs to which the laser beam is irradiated increases. As a result, an intensity of the fluorescence explained above becomes high. However, when the optical path of the laser beam that travels inside the diamond substrate is irregular as explained above, a measurement accuracy (a measurement error) of the magnetic field is not constant because it is difficult to predict changes of the fluorescence intensity due to errors of the incident angle of the laser beam that enters into the inside of the diamond substrate. As a result, it is difficult to perform accurate measurements.

SUMMARY

The present invention attempts to solve the above problems. An object of the present invention is to provide an excitation light irradiation device and an excitation light irradiation method that can achieve an accurate measurement in response to a light that is emitted by a color center (Farbe center or F center) in a substrate.

The excitation light irradiation device according to embodiments of the present invention has a substrate that has a color center that is excited by an excitation light. Specifically, with respect to the substrate, (a) two reflection surfaces being opposed (facing) to each other and two end surfaces being opposed (facing) to each other are provided, and (b) the excitation light that is incident on the substrate travels from an area near one of the end surfaces toward an area near the other of the end surfaces while (totally) reflecting between the two reflection surfaces. Further, the other of the end surfaces is inclined so that the excitation light is reflected at the other of the end surfaces and thereafter emitted from one of the two reflection surfaces.

With respect to the excitation light irradiation method according to embodiments of the present invention, the excitation light is irradiated to the color center included in the substrate. While the excitation light is (totally) reflected between the two reflection surfaces that are opposed to each other in the substrate, the excitation light that is incident on the substrate travels from an area near one of the two end surfaces that are opposed to each other toward an area near the other of the two end surfaces in the substrate. Further, the excitation light is reflected at the other of the end surfaces so that the excitation light is thereafter emitted from one of the two reflection surfaces due to the inclination of the other of the end surfaces.

According to embodiments of the present invention, an excitation light irradiation device and an excitation light irradiation method that can achieve an accurate measurement in response to a light that is emitted by a color center in a substrate can be obtained.

DESCRIPTION OF EXEMPLARY EMBODIMENTS

As discussed below, embodiments according to the present invention are explained with reference to the drawings.

Figure 1:
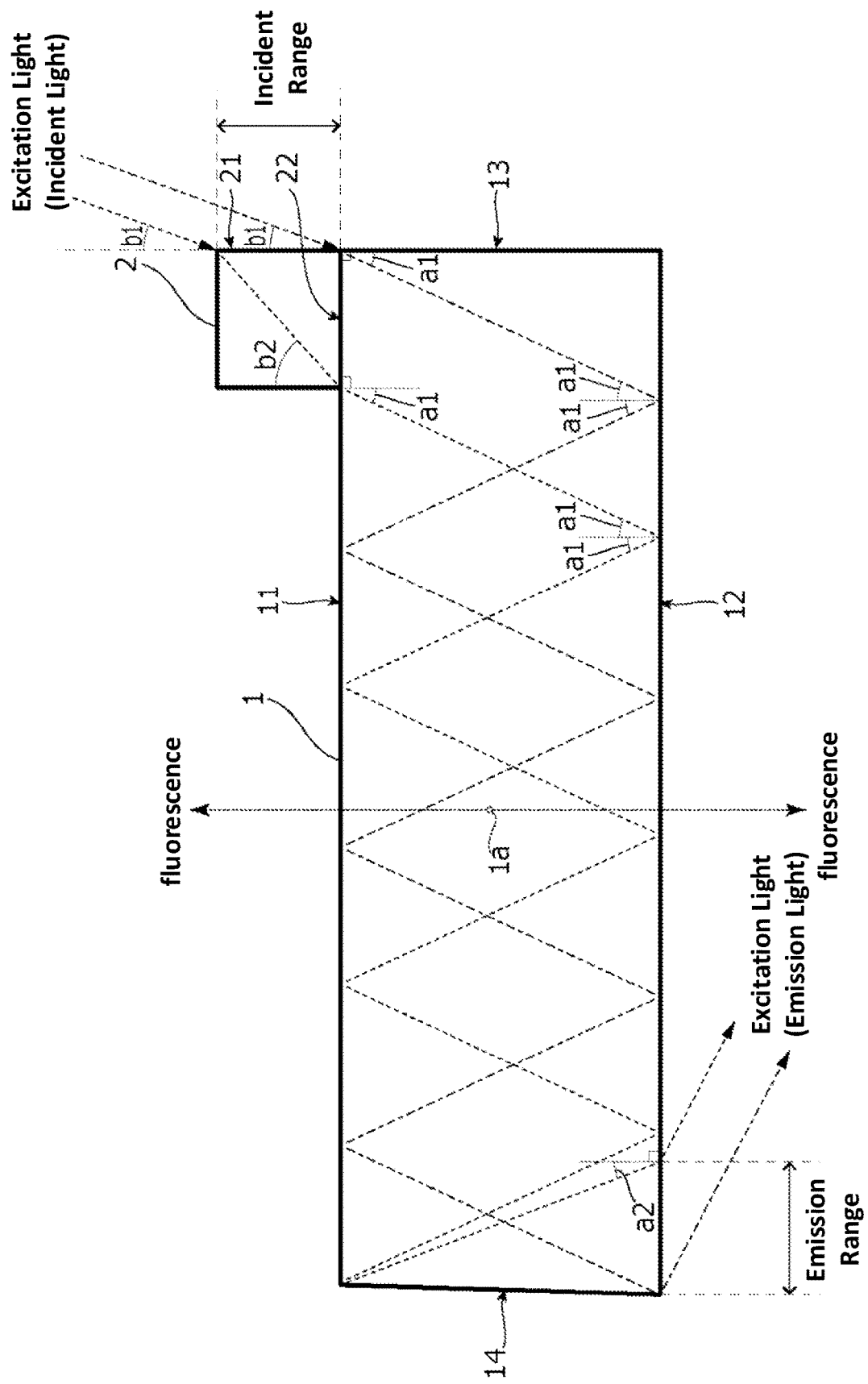
FIG. 1 is a side view that shows an excitation light irradiation device according to embodiments of the present invention.

FIG. 1 is a side view that shows an excitation light irradiation device according to an embodiment of the present invention.

The excitation light irradiation device shown in FIG. 1 has a substrate 1 that has one or a plurality of color centers (Farbe centers or F centers) 1a. The color center 1a is located at a specific position or an unspecified position of or in the substrate 1. When an excitation light having a predetermined wavelength is irradiated to the color center 1a, the color center 1a is excited. In other words, an energy level of an electron in the color center 1a moves to an excited state. According to the embodiment of the present invention, the substrate 1 is a diamond substrate and the color center 1a is the NVC. However, the type of substrate 1 and the color center 1a are not limited to the above examples.

The substrate 1 is an object of a crystal structure that has at least six sides (surfaces) and that has the color center 1a at any position of this crystal structure. Specifically, with respect to the substrate 1, (a) two (first and second) reflection surfaces 11 and 12 being opposed (facing) to each other and two (first and second) end surfaces 13 and 14 being opposed (facing) to each other are provided, and (b) the excitation light that is incident on the substrate 1 travels (propagates) from an area near the end surface 13 (one of the end surfaces) toward an area near the end surface 14 (the other of the end surfaces) while being totally reflected between the two reflection surfaces 11 and 12. Further, the end surface 14 is inclined so that the excitation light is reflected at the end surface 14 and is thereafter emitted from either (one) of the two reflection surfaces 11 and 12 (the excitation light is emitted from the reflection surface 12 as shown in FIG. 1).

According to the embodiment of the present invention, the reflection surfaces 11 and 12 are planar (flat) surfaces and are substantially parallel to each other. The end surfaces 13 and 14 are also planar (flat) surfaces. Further, the end surface 13 is substantially vertical (perpendicular) relative to the reflection surfaces 11 and 12. On the other hand, the end surface 14 is not perpendicular to the reflection surfaces 11 and 12. Further, for instance, a distance between the end surfaces 13 and 14 is in a range of approximately 1000 micrometers to 2000 micrometers. A distance between the reflection surfaces 11 and 12 is approximately 500 micrometers.

Specifically, with respect to the substrate 1, the excitation light that is incident on the substrate 1 travels from the area near the end surface 13 (one of the end surfaces) toward the area near the end surface 14 (the other of the end surfaces) while being reflected by (reflecting between) the two reflection surfaces 11 and 12 and satisfying the total reflection conditions. Further, the end surface 14 (the other of the end surfaces) is inclined with respect to the reflection surfaces 11 and 12 so that the excitation light is reflected at the end surface 14 and is thereafter emitted from either (one) of the two reflection surfaces 11 and 12 because the total reflection conditions are no longer satisfied at one of the two reflection surfaces 11 and 12.

That is, as shown in FIG. 1, the excitation light is incident from the outside into the inside of the substrate 1 under a condition in which an incident angle a1 (in an inside of the substrate 1) of the excitation light to the reflection surfaces 11 and 12 of the substrate 1 is less than a critical angle. Further, when the substrate 1 is the diamond substrate and a surrounding environment (other than the part that contacts an incident auxiliary (support or assistance) member 2) of the substrate 1 is the air, the critical angle that is determined by Snell's law is approximately 25 degrees.

Figure 2:
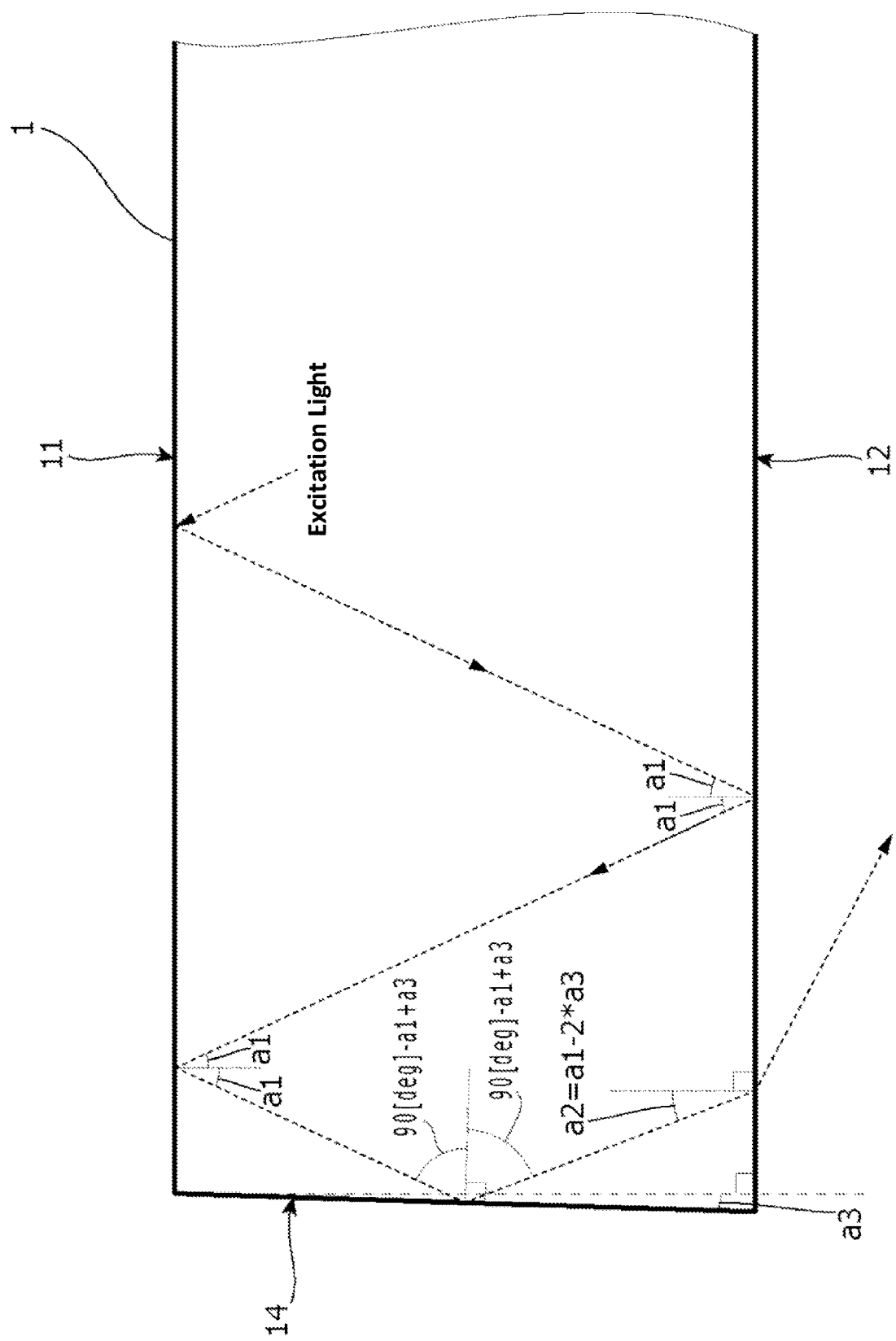
FIG. 2 is a side view for explaining an inclination angle of an end surface 14 of a substrate 1 shown in FIG. 1 according to the embodiments of the present invention.

FIG. 2 is a side view for explaining an inclination angle of the end surface 14 of the substrate 1 shown in FIG. 1 according to the embodiments of the present invention.

As shown in FIG. 2, when the end surface 14 is inclined relative to the vertical direction of the reflection surfaces 11 and 12 at an inclination angle a3, an incident angle a2 with respect to the reflection surface 12 of the excitation light that is totally reflected at the end surface 14 corresponds to an angle (a1−2×a3). Therefore, the incident angle a1 is set so as to be more than a critical angle m. At the same time, the incident angle a1 and the inclination angle a3 are set so that the angle (a1−2×a3) is less than the critical angle m. Further, at that time, the incident angle a1 and the inclination angle a3 are set so that the incident angle (90 degrees−a1+a3) with respect to the end surface 14 is more than the critical angle m.

That is, the inclination angle a3 (however, a3>0) is set so as to satisfy the following formula:

$$a3>(a1-m)/2.$$

As a result, the excitation light that is totally reflected at the end surface 14 is emitted from the reflection surface 12 to the outside without reaching the end surface 13 and the incident auxiliary member 2. Therefore, because the number of reflections of the excitation light in the substrate 1 is fixed to be a predetermined number of times, the optical path (eventually, the optical path length) of the excitation light in the substrate 1 does not become irregular due to errors of the incident angle b1 and the incident position of the excitation light.

In addition, the excitation light irradiation device shown in FIG. 1 also has the incident auxiliary member 2. The incident auxiliary member 2 is provided so as to direct the excitation light into the substrate 1 from either of the two reflection surfaces 11 and 12 of the substrate 1.

Specifically, the incident auxiliary member 2 is provided on the reflection surface 11 that is one of the two reflection surfaces 11 and 12 of the substrate 1. The excitation light is incident from the reflection surface 11 into the inside of the substrate 1. That is, the incident auxiliary member 2 has an incident surface 21 and an emission surface 22. Specifically, the excitation light is incident on the incident surface 21 of the incident auxiliary member 2. Further, the emission surface 22 is joined to the reflection surface 11 of the substrate 1 so as to emit the excitation light to the inside of the substrate 1 via the reflection surface 11. The incident surface 21 and the emission surface 22 are planar (flat) surfaces.

That is, the incident auxiliary member 2 is formed of a transparent material that has a different refractive index from a refractive index of the substrate 1. For instance, the transparent material explained above is a resin material (for instance, an acrylic resin, polyethylene terephthalate, polycarbonate, polyvinylchloride (PVC), polyethylene, polypropylene, polystyrene, an acrylonitrile-butadiene-styrene resin (an ABS resin), polyamide, tetrafluoroethylene, ethylene-vinyl acetate copolymer (EVA), a phenolic resin, melamine, unsaturated polyester, and epoxy), a glass, or a quartz crystal. Specifically, an excitation light, which is generated by a light source (not shown), is incident on the incident surface 21 of the incident auxiliary member 2 at the incident angle b1 and is refracted inside the incident auxiliary member 2. Thereafter, the refracted excitation light, which passes through the inside of the incident auxiliary member 2, is incident on a boundary surface (interface) between the substrate 1 and the incident auxiliary member 2 under a condition in which the total reflection condition is not satisfied. In other words, an incident angle b2 is more than a critical angle of the boundary surface (interface) between the incident auxiliary member 2 and the substrate 1. The excitation light that is incident on the boundary surface is refracted inside the substrate 1. As a result, the excitation light travels into the substrate 1 while being inclined at the incident angle a1 with respect to the vertical direction of the reflection surface 11 as shown in FIG. 2.

According to the embodiments of the present invention, the incident surface 21 of the incident auxiliary member 2 extends continuously in parallel with the end surface 13 of the substrate 1 as shown in FIG. 1. In other words, the incident surface 21 and the end surface 13 are coplanar and extend on the same plane.

Further, according to the embodiments of the present invention, the incident auxiliary member 2 is a substantially hexahedron. However, the surfaces other than the incident surface 21 and the emission surface 22 do not affect the optical path of the excitation light because the excitation light is not incident thereon. Therefore, these other surfaces of the incident auxiliary member 2 are not required to be planar (flat) surfaces.

According to the embodiments of the present invention, a height of the incident surface 21 and a width (the width along the longitudinal direction of the substrate 1) of the emission surface 22 are the same as each other. However, they can also be different from each other.

In addition, the excitation light irradiation device shown in FIG. 1 has an optical system including a light source that is not shown. With respect to the optical system, the light source emits the excitation light and the excitation light is incident on the incident auxiliary member 2 explained above at a predetermined incident angle. Further, when desired, an optical element (for instance, a mirror and/or a lens) is provided between the light source and the incident auxiliary member 2 along the optical path. As the light source, for instance, a semiconductor laser may be utilized. In this case, the excitation light is a laser beam. Further, as the excitation light, a light that has a relatively broad wavelength distribution can also be utilized instead of the laser beam. In this case, as the light source, a light emitting diode (LED) may be utilized. Note that when the color center is the NVC, the wavelength of the excitation light that is emitted from the light source is in a range of approximately 500 nanometers to 637 nanometers. Further, according to the embodiments of the present invention, an opening diameter of the light source (in other words, a diameter of the excitation light) is approximately 100 micrometers so that the excitation light is not irradiated outside of the predetermined incident range.

In addition, when the excitation light irradiation device shown in FIG. 1 is utilized as a magnetic field measurement device using the ODMR, the magnetic field measurement device has a coil, a high frequency power source, and a light receiving device in addition to the excitation light irradiation device shown in FIG. 1. Specifically, the coil applies a magnetic field of a microwave to the color center in the substrate 1. The high frequency power source conducts the current of the microwave to the coil. The light receiving device receives the light (fluorescence) that is generated by the color center and is emitted from the substrate 1. Further, the light receiving device outputs an electric signal corresponding to the intensity of the received light as a magnetic field measurement result. The light receiving device may be an optical sensor, such as a CCD, a Photomultiplier Tube (PMT), a phototube, a micro-channel plate (MCP), an active-pixel sensor (APS), a photoresistor, a photodiode, a Photovoltaics (PV) cell, or a photographic plate.

Next, operation of the excitation light irradiation device will be explained.

A control device (not shown) makes the light source (not shown) emit the excitation light and the emitted excitation light is incident on the incident surface 21 of the incident auxiliary member 2 as explained above.

The excitation light is refracted at the incident surface 21 of the incident auxiliary member 2 and enters into the inside of the substrate 1 at the incident angle a1 through the boundary surface (interface) of the incident auxiliary member 2 and the substrate 1 (in other words, the boundary surface between the emission surface 22 and the reflection surface 11).

After the excitation light enters into the substrate 1, the excitation light impinges on the two reflection surfaces 11 and 12 that are opposed to each other of the substrate 1 at an incident angle less than the critical angle. As a result, while the excitation light is alternatively reflected from the reflection surfaces 11 and 12, the excitation light travels (propagates) from the area near the end surface 13 toward the area near the end surface 14 that are opposed to each other of the substrate 1.

Thereafter, the excitation light is incident on the end surface 14 of the substrate 1. The end surface 14 of the substrate 1 is inclined at the inclination angle a3 with respect to the vertical direction to (normal line with respect to) the parallel reflection surfaces 11 and 12. Thus, after the excitation light is reflected at the end surface 14, the excitation light is incident on the reflection surface 12 at the incident angle a2 which is less than the critical angle so as to be emitted from the reflection surface 12. Therefore, in the embodiments shown in FIG. 1, the excitation light is reflected by the reflection surfaces 11 and 12 in the substrate 1 six times. After the excitation light is reflected by the end surface 14, the excitation light exits to the outside of the substrate 1 by being transmitted through one of the reflection surfaces 11 and 12 without being re-reflected by the reflection surfaces 11 and 12.

As explained above, since the excitation light travels inside the substrate 1, the color center 1a that exists on the optical path of the excitation light in the substrate 1 is excited by the excitation light. As a result, the color center 1a emits the fluorescence that has a predetermined wavelength.

For instance, when the excitation light irradiation device according to the embodiments of the present invention is utilized for a magnetic field measurement using the ODMR, the fluorescence corresponding to the intensity of the magnetic field being measured is generated by the color center $1a$ due to the excitation of the color center $1a$ by the excitation light. As a result, the component in the fluorescence that is emitted from the substrate 1 is detected by, for instance, the light receiving device (not shown).

As explained above, the excitation light irradiation device according to the embodiments of the present invention has the substrate 1 that has the color center $1a$. Specifically, the color center is excited by the excitation light. Specifically, with respect to the substrate 1, (a) two reflection surfaces 11 and 12 that are opposed to each other and two end surfaces 13 and 14 that are opposed to each other are provided, and (b) the excitation light that is incident on the substrate 1 travels from the area near the end surface 13 toward the area near the end surface 14 while reflecting between the two reflection surfaces 11 and 12. Further, the end surface 14 is inclined so that the excitation light is reflected at the end surface 14 and emitted (exited) from either of the two reflection surfaces 11 and 12.

Thus, the optical path length does not easily change (e.g., is essentially constant) because the number of reflections of the excitation light in the substrate 1 is fixed to be a predetermined number. As a result, the measurement based on the light that is generated/emitted by the color center $1a$ in the substrate 1 can be accurately performed.

Further, according to variations of the embodiments of the present invention, the reflection surfaces 11 and 12 and the end surface 13 except for the installation location of the incident auxiliary member 2 can be coated with a material that enhances the reflectivity (in other words, a material that decreases the critical angle satisfying the total reflection condition as compared with the air).

In addition, the present invention can be applied, for instance, to the excitation light irradiation device and the excitation light irradiation method that are utilized for the magnetic field measurement using the ODMR.

The excitation light irradiation device and the excitation light irradiation method being thus described, it will be apparent that the same may be varied in many ways. Such variations are not to be regarded as a departure from the spirit and scope of the invention, and all such modifications as would be apparent to one of ordinary skill in the art are intended to be included within the scope of the following claims. Further, the above embodiments can be combined with each other and such combinations are not to be regarded as a departure from the spirit and scope of the invention.

What is claimed is:

1. An excitation light irradiation device comprising:
   a substrate having a color center, the color center being configured to be excited by an excitation light incident to the substrate, the substrate including:
   first and second reflection surfaces reflecting the excitation light;
   first and second end surfaces facing each other; and
   an incident auxiliary member having an incident surface and an emission surface which is joined to the first reflection surface,
   wherein, the excitation light enters into the incident surface of the incident auxiliary member, passes through the incident auxiliary member, and emits from the emission surface of the incident auxiliary member into the first reflection surface of the substrate,
   the excitation light, which has entered into the first reflection surface of the substrate, travels from a first area near the first end surface to a second area near the second end surface while repeatedly reflecting between the first and second reflection surfaces, and
   the incident surface of the incident auxiliary member and the first end surface are coplanar.

2. The excitation light irradiation device according to claim 1,
   wherein, after the excitation light enters into the substrate, the excitation light travels from the first area near the first end surface to the second area near the second end surface while being total internally reflected between the first and second reflection surfaces, and
   the excitation light, which is thereafter reflected at the second end surface, exits from one of the first and second reflection surfaces.

3. The excitation light irradiation device according to claim 2,
   wherein a light enter direction, along which the excitation light enters into the incident surface of the incident auxiliary member, intersects a light exit direction, along which the excitation light exits from the substrate.

4. The excitation light irradiation device according to claim 1,
   wherein the second end surface is inclined, and the second end surface reflects the excitation light so as to cause the excitation light to exit from one of the first and second reflection surfaces.

5. The excitation light irradiation device according to claim 4,
   wherein a light enter direction, along which the excitation light enters into the incident surface of the incident auxiliary member, intersects a light exit direction, along which the excitation light exits from the substrate.

6. The excitation light irradiation device according to claim 1,
   wherein the substrate is a diamond substrate.

7. The excitation light irradiation device according to claim 6,
   wherein a light enter direction, along which the excitation light enters into the incident surface of the incident auxiliary member, intersects a light exit direction, along which the excitation light exits from the substrate.

8. The excitation light irradiation device according to claim 1,
   wherein the incident auxiliary member is formed of a transparent material that has a different refractive index from a refractive index of the substrate.

9. The excitation light irradiation device according to claim 8,
   wherein the incident auxiliary member is formed from a resin material, a glass, or a quartz crystal, and
   the resin material is one of an acrylic resin, a polyethylene terephthalate, a polycarbonate, a polyvinylchloride, a polyethylene, a polypropylene, a polystyrene, an acrylonitrile-butadiene-styrene resin, a polyamide, a tetrafluoroethylene, an ethylene-vinyl acetate copolymer (EVA), a phenolic resin, a melamine, an unsaturated polyester, and an epoxy.

10. The excitation light irradiation device according to claim 9,
    wherein a light enter direction, along which the excitation light enters into the incident surface of the incident auxiliary member, intersects a light exit direction, along which the excitation light exits from the substrate.

11. The excitation light irradiation device according to claim 8,
wherein a light enter direction, along which the excitation light enters into the incident surface of the incident auxiliary member, intersects a light exit direction, along which the excitation light exits from the substrate.

12. The excitation light irradiation device according to claim 1,
wherein a light enter direction, along which the excitation light enters into the incident surface of the incident auxiliary member, intersects a light exit direction, along which the excitation light exits from the substrate.

* * * * *